(12) United States Patent
Moden

(10) Patent No.: US 6,637,103 B2
(45) Date of Patent: Oct. 28, 2003

(54) METHOD OF TAPE BONDING

(75) Inventor: Walter L. Moden, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 10/005,410

(22) Filed: Dec. 3, 2001

(65) Prior Publication Data

US 2002/0079124 A1 Jun. 27, 2002

Related U.S. Application Data

(62) Division of application No. 09/376,699, filed on Aug. 18, 1999, now Pat. No. 6,362,429.

(51) Int. Cl.[7] .................................................. H05K 3/30
(52) U.S. Cl. ............................ 29/832; 29/827; 29/874
(58) Field of Search ........................ 29/827, 825, 874, 29/832

(56) References Cited

U.S. PATENT DOCUMENTS

| 3,864,728 | A | * | 2/1975 | Peltz et al. |
| 4,355,463 | A | * | 10/1982 | Burns |
| 4,616,412 | A | * | 10/1986 | Schroeder |
| 4,746,392 | A | * | 5/1988 | Hoppe |
| 4,835,847 | A | * | 6/1989 | Kamperman |
| 5,065,506 | A | * | 11/1991 | Kirbayashi |
| 5,787,581 | A | * | 8/1998 | DiStefano et al. |

* cited by examiner

Primary Examiner—Carl J. Arbes
(74) Attorney, Agent, or Firm—Trop, Pruner & Hu, P.C.

(57) ABSTRACT

A tape bonding system may include a tape and a lead coupled to the tape. The lead may have a stress relief formed along its length which is adapted to relieve stresses and strains arising from differential thermal expansion of the materials to which the tape is coupled. The lead may have a first portion supported by the tape and a second portion which is unsupported by the tape due to an opening in the tape. The unsupported portion of the tape may be deflected to make contact with a bond pad. In this configuration, the lead may accommodate differential thermal expansion by cantilevered beam displacements. In addition, due to the provision of a stress relief, the beam can respond in a totally different rotational displacement to compressive stresses parallel to the surfaces of the integrated circuit elements being joined.

10 Claims, 4 Drawing Sheets

METHOD OF TAPE BONDING

This is a divisional of prior application Ser. No. 09/376,699 filed Aug. 18, 1999 now U.S. Pat. No. 6,362,429.

BACKGROUND

This invention relates generally to tape automated bonding techniques for making electrical connections to integrated circuit devices.

Integrated circuit devices in the form of an unpackaged die or chip are typically packaged to provide electrical connections. These electrical connections allow the die or chip to be connected to other devices. While it is possible to produce very small elements in integrated circuit devices, because of the mechanical nature of the contacts, generally the contacts must be large relative to the size of the die or chip.

Therefore, it is not uncommon that the contacts on an integrated circuit package take as much surface area as the entire integrated circuit die itself. However, there is a continuing effort to reduce the size and spacing between such contacts to allow ever smaller integrated circuit packages. Such interconnection assemblies in relatively small dimensions are commonly called fine pitch assemblies.

One popular interconnection technique is a so called ball grid array (BGA). An array of solder balls may be coupled to another component by simply contacting bonding pads on one device to the solder balls on another device and heat reflowing to activate the solder. Techniques for providing very fine pitch ball grid array packages are commonly called fine pitch ball grid array (FBGA) packaging.

Thus, in one example, an integrated circuit device having a plurality of solder balls extending outwardly from the package may simply be placed on a printed circuit board. When subjected to temperature reflow, the integrated circuit device is automatically connected to the printed circuit board in a so-called surface mount technique.

Tape automated bonding or TAB provides a high speed technique for providing interconnections to chips. In effect, an interconnection layer provided in the form of a continuous adhesive tape may be secured to the die in an automated fashion. Metallic leads inside the tape layer may then be caused to contact bond pads on the die. At the same time, the other side of the tape layer may be adapted to make connections to the outside world. For example, tape layers may be coupled to solder balls. In this case, the tape may make electrical connection to bond pads on the die on one side and may couple to solder balls on the other side for connection to the outside world. A layer of traces within the tape layer may be used to connect the solder balls to the bond pads on the die.

Because of the different materials involved in making the die and the tape layers, the tape layers may have a different temperature coefficient of expansion (TCE) than the die or chip to which it is connected. This may result in failure of the interconnection and ultimately the loss of the entire packaged integrated circuit device.

Techniques are known for facilitating the relative expansion between the tape layer and the die. For example, in one known technique, the tape layer includes a cantilevered metallic beam which is deflected to make contact with bond pads on the die. Through an elaborate procedure, the beam is bent down to make contact with the die in a way which, in effect, provides a bow in the beam. This is done by pushing the beam down and axially towards its support at the same time, creating the bowed shape. In this way, the relative thermal expansion may be accounted for by bending motion within the bowed cantilevered beam.

As an analogy, the cantilevered beam is attached on two ends like a bow for a bow and arrow as indicated in FIGS. 6A and 6B. When the ends move towards each other as indicated by the arrows I and J in FIG. 6A, the beam simply deflects outwardly, as indicated by the arrow K, on the convex side of the beam to accommodate for the relative motion. Similarly, in response to a vertical displacement, indicated by the arrows L and M in FIG. 6B, the beam bows in the direction of the arrow N. Displacement of the ends of the beam, in substantially any direction, is transformed into either an increase or decrease in the bowing of the beam around the same central axis, indicated at C, of the beam.

This bowing has a beneficial effect in one sense because the stress is advantageously relieved, increasing the life of the system. However, regardless of the direction of the applied force, the response of the beam is the same. It always deflects around the same axes. This results in an increase in the amount of strain which must be withstood by the beam. In addition, the bowing tends to concentrate stresses at the points where the ends of the beam are connected to the die or the tape, thereby creating a stress riser at these locations. Unfortunately, these locations are among the most highly stressed in the entire system, increasing the possibility of failure at these locations.

Thus, there is a continuing need for better ways to relieve stress in tape bonding systems and especially for better ways to relieve stress in fine pitch assemblies.

SUMMARY

In accordance with one aspect, a tape bonding system includes a tape and a conductive lead. The lead is situated in a surface and is secured to the tape. The lead is adapted to be bonded to a bond pad at one location and to be supported by the tape at another location. A stress relief is formed in the lead between the two locations. The stress relief is adapted to convert stress along the lead into rotation about an axis substantially transverse to the surface in which the lead is situated.

Other aspects are described in the accompanying detailed description and claims.

DETAILED DESCRIPTION

Figure 1:
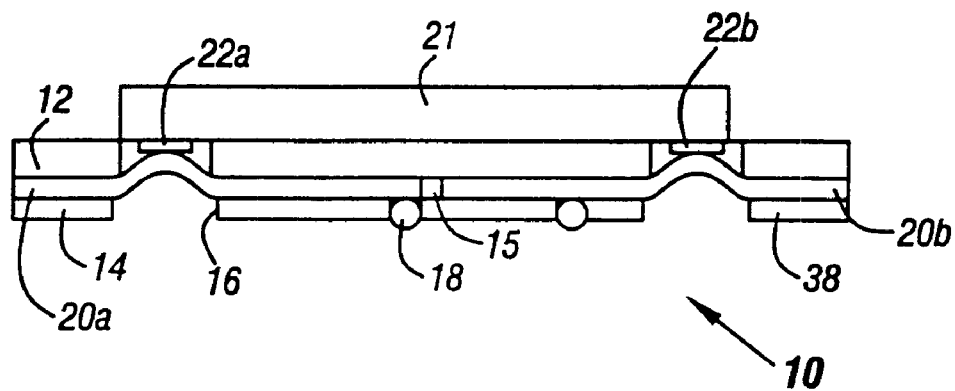
FIG. 1 is an enlarged cross-sectional view of one embodiment of the present invention.

A tape bonding system 10, shown in FIG. 1, may include a conductive lead 20 sandwiched between a pair of dielectric layers 12 and 14. The layer 14 may be an elastomeric layer which may be formed, for example, of solder mask material. The layer 12 may be formed, for example, of a relatively resilient polyimide layer. A plurality of openings 16 may be formed in the dielectric layers 12 and 14, leaving the lead 20 generally unsupported at those locations by the tape bonding system 10. In addition, a plurality of openings in the dielectric layer 14 may be filled by solder balls 18.

The tape bonding system 10 may be connected to an integrated circuit die or chip 21 by adhesive securement techniques. The die 21 may include bond pads 22 which may be arranged adjacent the openings 16 through the dielectric layers 12 and 14. As illustrated, the conductive lead 20 is deflected in a U-shaped configuration to make electrical contact to a bond pad 22. Similarly, each lead 20 is electrically coupled to a solder ball 18 as well.

Thus, in the illustrated embodiment, a pair of leads 20a and 20b having a gap 15 between them are situated within the same tape system for one die 21. The lead 20a is connected to a bond pad 22a and the lead 20b is connected to a bond pad 22b. However, in some embodiments, only a single lead may be provided across the die. Conventionally however, a number of leads may be provided in the tape bonding system 10 displaced in and out of the plane shown in FIG. 1. Thus, an electrical coupling may be achieved between the die 21 and the solder balls 18 by way of the leads 20.

Figure 2:
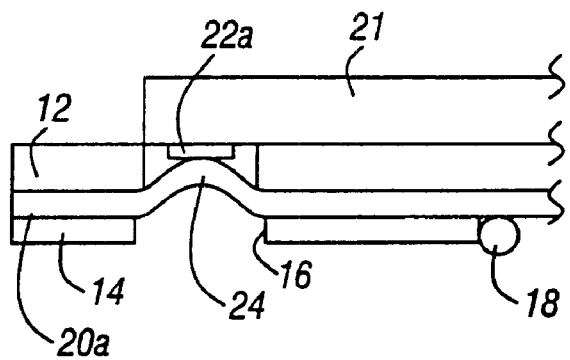
FIG. 2 is an enlarged view of a portion of the embodiment shown in FIG. 1.

As shown in FIG. 2, the U-shaped portion 24 of the lead 20a in the opening 16 is deflected towards the die 21. This deflection is possible because of the support, at either side of the opening 16, provided the elastomeric dielectric layer 12.

Figure 3:
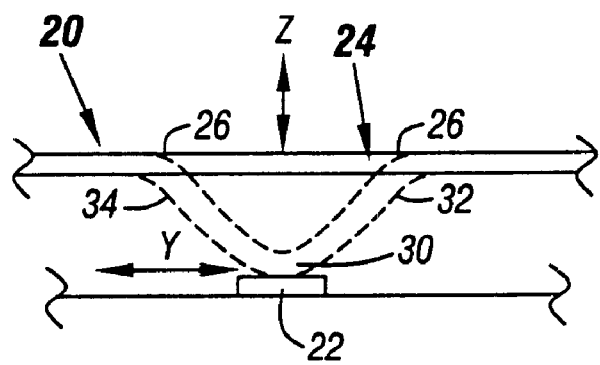
FIG. 3 is a partial, enlarged inverted view of a portion of the embodiment shown in FIG. 1 before the lead is deflected to contact a die.

As shown in FIG. 3, the connection to a bond pad 22 may be supplied by deflecting the lead 20 in the Z-axis direction, to assume the dashed line position, causing bends to occur at 26. When the lead portion 30 contacts the bond pad 22, the lead may be bonded thereto using heat, sonic energy or other conventional bonding techniques. In this configuration, best shown in FIG. 3, effectively a leaf spring exists between the portion 30 and the supported portions 32 and 34 of the lead 20.

Thus, expansion and contraction of the die 21 relative to the tape bonding system 10 may result in bending at the bends 26 which amounts to substantially a spring stress relieving system. In such case, differential thermal expansion may be accommodated in the Z axis direction. In other words, if the die 21 and the tape bonding system 10 expand or contract differentially because of their different temperature coefficients of expansion (TCE), this may be accommodated for through bending at the bends 26.

Figure 4:
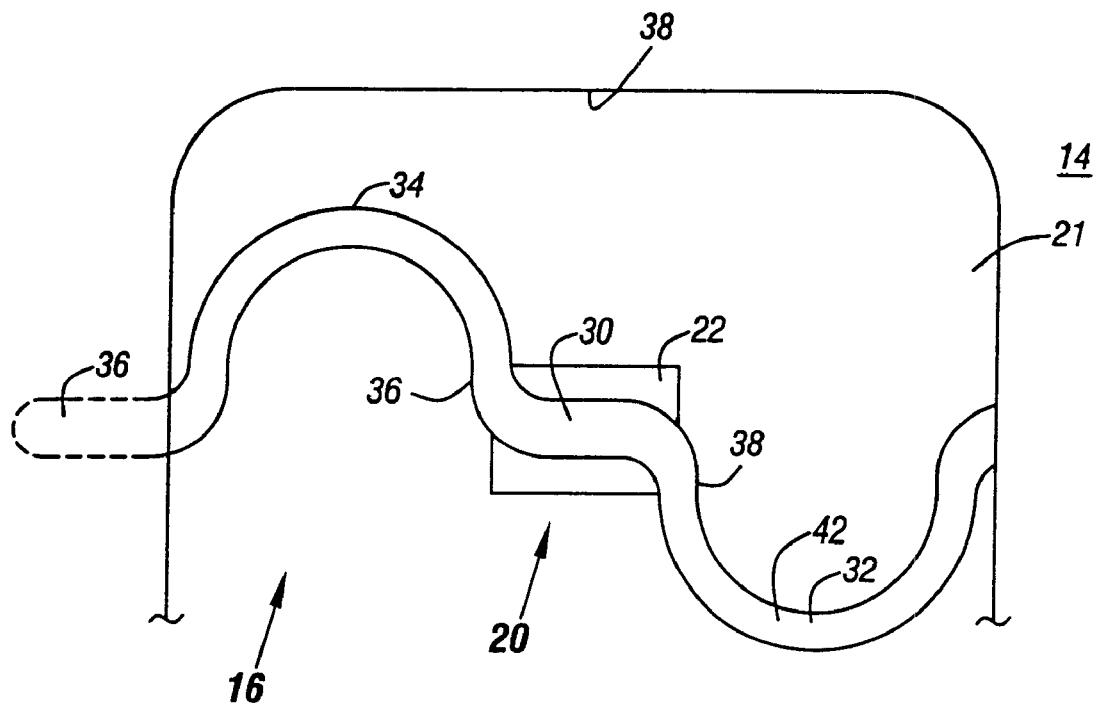
FIG. 4 is a greatly enlarged bottom plan view of the embodiment shown in FIG. 1 with the solder balls removed.

Referring to FIG. 4, the overall shape of the lead 20 in an opening 16 is illustrated. The lead 20 includes a pair of U-shaped stress relieving portions 32 and 34 on either side of the portion 30 secured to the bond pad 22. In addition, an anchor tab 36 is provided to anchor the lead 20 on one side of the opening 16 and a supported portion 33 may be provided on the other side of the opening 16. The S-shaped lead portion proximate to the portion 30 is useful in providing greater tolerance in aligning the portion 30 to the bond pad 22. If there is slight misalignment, the adjacent portions of the stress relieving portions 32 or 34, indicated at 36 and 38, may still align with the bond pad 22 providing a useful device.

Figure 5A:
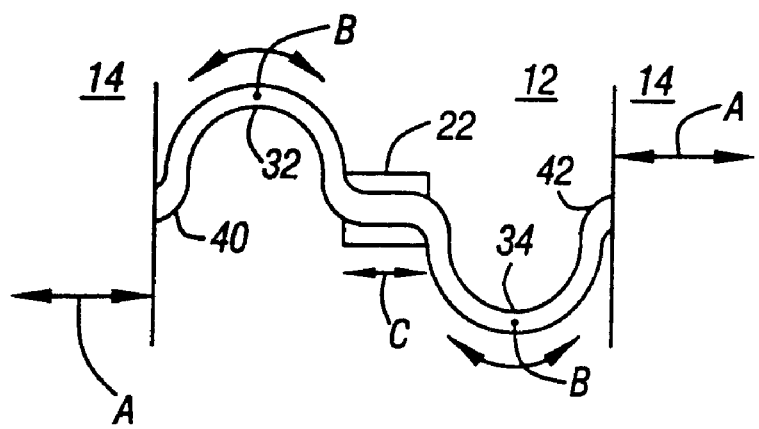
FIG. 5A is a schematic bottom plan depiction of the embodiment shown in FIG. 4 illustrating the response of the system to differential thermal expansion.
Figure 5B:
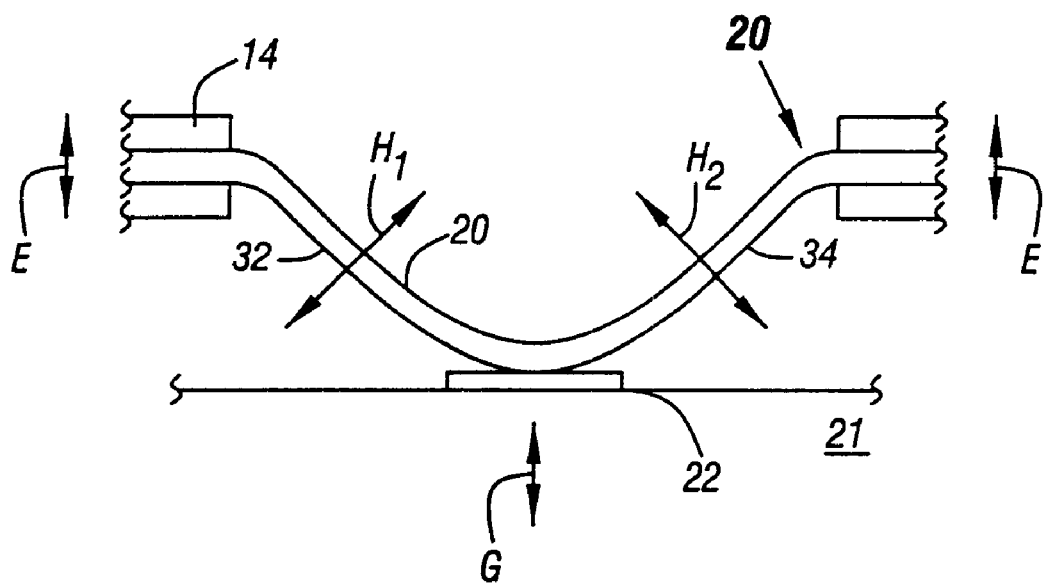
FIG. 5B is a schematic side elevational depiction corresponding to the view shown in FIG. 3 showing the response of the system of differential thermal expansion.

The response of the system 10 to differential thermal expansion is best shown in FIGS. 5A and 5B. FIG. 5B shows the response to differential thermal expansion/contraction in the directions of the arrows E and G. In FIG. 5B the arrows E correspond to displacement of the tape system 10 in response to thermal expansion of the tape system relative to a device to which the tape system is electrically coupled. The arrows G indicate the displacement of the die 21. Differential thermal expansion results in the motion H1 and H2 in the two sections 32 and 34. Thus, relative thermal expansion in the vertical direction in FIG. 5B may be accommodated for by displacements of the lead 20 in the direction of the arrows H1 and H2. Such displacements are effectively rotations about the axis substantially within the surface that the lead 20 occupies.

Conversely, referring to FIG. 5A, differential thermal expansion indicated by arrows A and C results in a different stress relief mechanism. In this case, stress relieving portions 32 and 34 are caused to deflect around the axes B. Thus, in response to differential thermal expansion or contraction, the leads bow as indicated in FIG. 5B. In response to differential thermal stresses in the transverse direction, the lead portions on either side of the axis B respond around the axis B traverse to the plane of the lead 20. In this way, there are effectively two different responses to two different stresses. This effectively increases the life of the leads.

Particularly, the stresses illustrated in FIG. 5A are believed to be the most important and most likely stresses. It can be seen that the response of the system is to rotate about the axis B. This removes the stresses from the areas 40 and 42 which are believed to be, in most cases, the most sensitive areas of the entire system. Because of the deflections already induced at these areas, these areas may be the most prone to failure. Therefore, by providing the stress relievers 32 and 34, the maximum stress and strain have been moved from sensitive areas to areas which have been specifically designed to accommodate such stresses and strains.

In some embodiments, to further ensure that these stresses are displaced from the sensitive areas, the areas proximate to the rotational axes B may be weakened or reduced in thickness. As a result, these weakened or reduced areas preferentially absorb such stresses and strains.

It is believed that the strains shown in FIG. 5A are likely to be the most common or predominate strains because they correspond to the major surfaces of the components being joined. It is believed that the predominant thermal expansion will be in these directions because of the greater dimensions, in these directions, of the objects being joined.

Figure 6A:
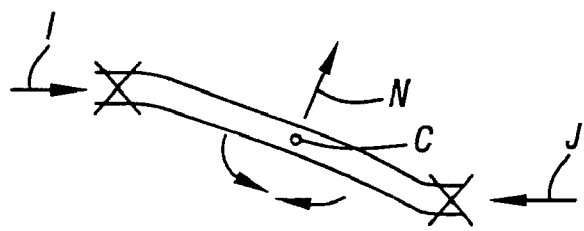
FIG. 6A is a side view corresponding to FIG. 5B in a prior art embodiment, illustrating the response to compressive stress.
Figure 6B:
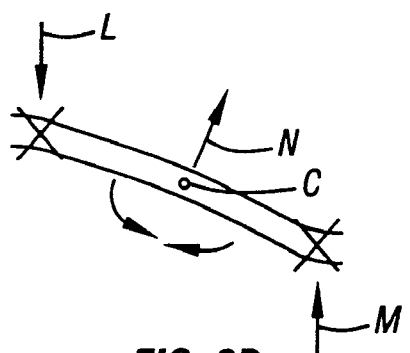
FIG. 6B is a side view of a prior art lead illustrating its response to a compressive stress applied transversely to the direction illustrated in FIG. 6A.

To further illustrate the point, FIGS. 6A and 6B show the response of a system which does not include the stress relievers 32 and 34. In FIG. 6A in response to a compressive stress, it can be seen that the lead acts as effectively a bow, bowing outwardly in the direction of the arrow K. This is also an effective rotation in the direction of the arrows about the axis C. Similarly, in response to a vertical compressive displacement, effectively the same response occurs. Again, the system responds the same way to forces in different directions increasing the concentration of strain which a location encounters over its life.

Moreover, the system tends to accentuate the strains which must be borne near the points of attachment indicated by Xs in FIGS. 6A and 6B. These areas, which have already been subject to bending to form the lead, tend to be the most sensitive if not the most strain intolerant regions of the lead system. Thus, the provision of the stress relievers 32 and 34 improves the performance of the system in response to the predominant strain likely to be encountered and provides an alternate strain relief mechanism which may increase the lifetime of the system 10 in some embodiments.

Figure 7:
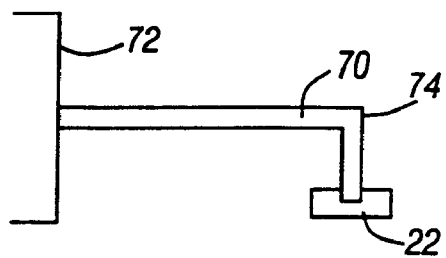
FIG. 7 is an enlarged bottom plan view of still another embodiment of the present invention.

Referring to FIG. 7, another embodiment of the present invention is illustrated. In this case, a bond pad 22 is coupled by an L-shaped lead 70 to a support structure 72. However in response to the predominant forces of the type indicated in FIG. 5A, the bend 74 acts as a stress reliever. The bend 74 causes rotation about an axis transverse to the surface containing the leads 70. Again a differential response to strains in different directions is created and also the response of the system is moved away from the sensitive connections to support regions. In this case, the system may not be bilaterally symmetrical. The bilateral symmetry, shown for example in FIG. 4, has a number of advantages which are described hereinafter.

Figure 8:
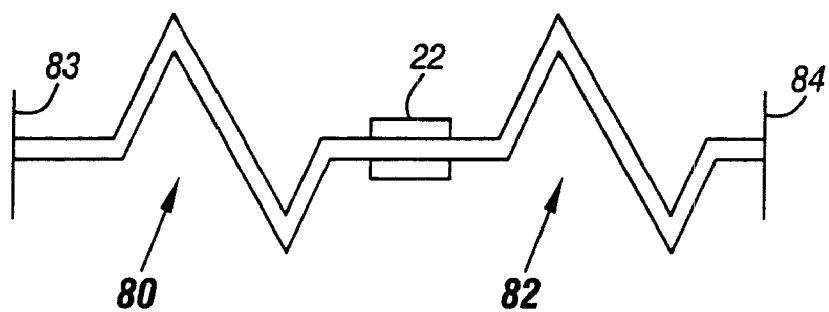
FIG. 8 is an enlarged bottom plan view of still another embodiment of the present invention.

Referring next to FIG. 8, a system which is similar to that shown in FIG. 4 but which provides a pair of opposed stress relievers 80 and 82 in a bilaterally symmetrical system is illustrated. In this case, the bond pad 22 is situated between a first support 83 and a second support 84. The provision of dual stress relievers 80 and 82 further improves the preferential response of the system about the center portion of the lead as opposed to providing bending response adjacent points of support.

Figure 9:
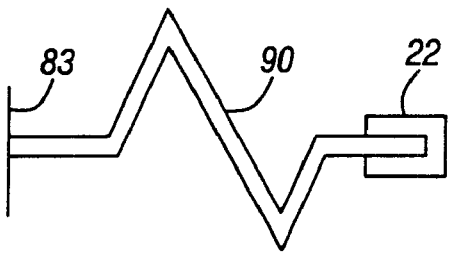
FIG. 9 is an enlarged bottom plan view of yet another embodiment of the present invention.
Figure 10:
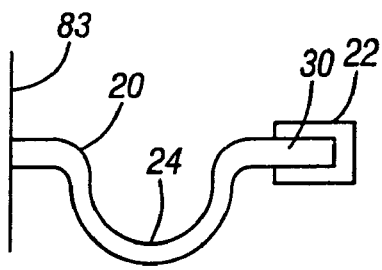
FIG. 10 is an enlarged bottom plan view of still another embodiment of the present invention.

FIG. 9 is a system similar to that shown in FIG. 5A but using a V-shaped stress reliever 90 as opposed to a U-shaped stress reliever 32 or 34. While FIG. 9 shows a system which is not bilaterally symmetrical, as in the other cases, a bilaterally symmetrical embodiment may be used as well. Thus, as shown in FIG. 10, a non-bilaterally symmetrical embodiment corresponding to FIG. 4.

A bilaterally symmetrical embodiment may provide a number of important advantages in some embodiments. It may provide greater tolerance in matching the lead to the bond pad 22 during initial positioning. As explained above, the portions proximate to the region 30 may also assist in ensuring that even if the lead is displaced from the position intended, good contact with the bond pad is still obtained.

Bilateral symmetry may also tend to balance the forces applied to the stress relievers. That is, opposite rotations occur which may tend to balance the effect supplied to the portions of the lead 20 adjacent the bond 22.

Through the use of the anchor 36, shown in FIG. 4, the leads 20 may be plated in position. The anchor 36 may be coupled to a source of potential which may be utilized to plate the leads 20 in place. For example, it may be desirable to plate the leads with a gold material. In some cases the leads may be made of one material and then plated with gold material. The gold material may be desirable in some cases in making better bonds. The lead 20 may have a core made of a highly resilient, ductile material since some stressing of the lead may occur during its downward displacement to make contact to the bond pad 22. Thus, a lead, made of a core material chosen for ductility such as aluminum, may achieve improved contact characteristics by electroplating gold over the lead for improved contactibility. Examples of other materials for forming the lead core include copper, aluminum, platinum, nickel, and alloys and combinations of those materials.

The connection between the tape and the die 21 may be implemented using well known, commercially available tape automated bonding techniques. Automatic positioning equipment may be used to facilitate alignment between the bonding pads 22 and the regions 30 of the leads 20. Similarly, conventional techniques may be utilized to couple the leads 20 to the outside world, for example through solder balls. While a ball grid array packaging technique is illustrated, other connection techniques may be used in some embodiments.

Among other advantages of embodiments of the present invention is that it is no longer necessary to provide elaborate techniques for positioning the lead on the bond pad. For example, in one known technique, it is necessary to displace the lead towards the pad while at the same time, axially compressing the lead towards it point of support. This provides the bowing orientation shown in FIGS. 6A and 6B. Because a different mechanism is utilized for absorbing stresses in embodiments of the present invention, it is not necessary to provide this pre-set bow. Eliminating the pre-set bow may simplify the installation of the leads, reducing the likelihood of failure and reducing cost.

Moreover, with embodiments of the present invention, it is not necessary to break the lead in the process of positioning it. The process of breaking the lead may create weakened or strained locations in the lead resulting in subsequent failure. In addition, a process that does not require the lead breaking step may be considerably simpler to implement.

Embodiments of the present invention may be installed using tape automated bonding techniques at relatively high speed. The tape may be provided in a continuous form having a plurality of portions having sufficient leads to couple to one die. Succeeding sections may be cut off and applied to a series of succeeding dies.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of tape bonding integrated circuits comprising:

providing an offset along the length of a cantilevered beam lead to form an offset cantilevered beam lead; and deflecting said offset cantilevered beam lead to contact a die.

2. The method of claim 1 wherein said offset cantilevered beam lead is deflected intermediately along its length.

3. The method of claim 2 including bonding said lead intermediately along its length to said die.

4. The method of claim 1 including causing said offset cantilevered beam lead to rotate about an axis transverse to the direction that it was deflected.

5. The method of claim 4 including causing the offset cantilevered beam lead to respond to differential thermal expansion by rotating around an axis transverse to the length of said beam lead.

6. The method of claim 5 including causing said offset cantilevered beam lead to absorb compressive and tensile stresses in said offset.

7. The method of claim 1 including providing a pair of cantilevered beam lead portions to either side of a portion of said lead secured to said die.

8. The method of claim 7 including providing an offset in each of said beam lead portions.

9. The method of claim 8 including providing offsets in each beam lead portion, said offsets extending in opposite directions.

10. The method of claim 7 including forming a pair of unsupported portions in said beam lead on either of side of said contact to said die.

\* \* \* \* \*